United States Patent
Lee et al.

(10) Patent No.: US 10,754,471 B2
(45) Date of Patent: Aug. 25, 2020

(54) TOUCH SENSING DEVICE AND IMAGE DISPLAY DEVICE USING THE SAME

(71) Applicant: LG DISPLAY CO., LTD., Seoul (KR)

(72) Inventors: Seungjun Lee, Daegu (KR); Sangsoo Han, Paju-si (KR); Sangmin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/204,539

(22) Filed: Nov. 29, 2018

(65) Prior Publication Data

US 2019/0163322 A1 May 30, 2019

(30) Foreign Application Priority Data

Nov. 29, 2017 (KR) .......................... 10-2017-0161333

(51) Int. Cl.
  *G06F 3/041* (2006.01)
  *G01R 31/28* (2006.01)
  *G06F 3/044* (2006.01)

(52) U.S. Cl.
  CPC ....... *G06F 3/0418* (2013.01); *G01R 31/2829* (2013.01); *G06F 3/0412* (2013.01); *G06F 3/0443* (2019.05); *G06F 3/04166* (2019.05)

(58) Field of Classification Search
  CPC .. G06F 3/0418; G06F 3/04166; G06F 3/0443; G06F 3/0412; G01R 31/2829
  See application file for complete search history.

(56) References Cited

U.S. PATENT DOCUMENTS

| | | | | |
|---|---|---|---|---|
| 5,768,496 A | * | 6/1998 | Lidgett | G06F 11/0787 714/25 |
| 2002/0109414 A1 | * | 8/2002 | Nitta | B41J 2/0451 307/109 |
| 2009/0250268 A1 | * | 10/2009 | Staton | G06F 3/0412 178/18.06 |
| 2012/0056835 A1 | * | 3/2012 | Choo | G06F 3/0412 345/173 |

* cited by examiner

*Primary Examiner* — Patrick N Edouard
*Assistant Examiner* — Joseph P Fox
(74) *Attorney, Agent, or Firm* — Birch, Stewart, Kolasch & Birch, LLP

(57) ABSTRACT

A touch sensing device and an image display device using the same are discussed. The touch sensing can include touch sensors included in an image display panel, a touch sensing circuit unit configured to supply a driving signal to the touch sensors, receive a touch voltage from the touch sensors and generate sensing data based on a touch sensing result of the image display panel, and a micro control unit configured to determine whether or not the plurality of touch sensors, the touch sensing circuit unit and a self-stored firmware operate normally when a power source of the touch sensing device is turned on, and allow a touch sensing operation to be operated normally or delay a reset operation in a predetermined period unit and repeatedly perform the reset operation in a predetermined delay period unit based on a result of previous determination.

13 Claims, 4 Drawing Sheets

TOUCH SENSING DEVICE AND IMAGE DISPLAY DEVICE USING THE SAME

CROSS-REFERENCE TO RELATED APPLICATION

This application claims priority under 35 U.S.C. § 119 to Korean Application No. 10-2017-0161333, filed on Nov. 29, 2017 in the Republic of Korea, whose entire disclosure is herein incorporated by reference into the present application.

BACKGROUND

1. Field of the Invention

The present disclosure relates to a touch sensing device which can support a user or worker to quickly and easily resolve an initial driving (or rebooting) defect occurring due to an abnormality in an initial power supply, an abnormality in a communication interface and the like, and relates to an image display device using the touch sensing device.

2. Description of Related Art

Recently, touch screen technology in which a user is able to directly input information with a finger or a pen as an input device of a flat panel display device has been used.

The touch screen technology is divided into an add-on type and an in-cell type based on the position of a sensor. The add-on type has a structure in which a touch sensor is attached on a liquid crystal module (LCM). The in-cell type is a built-in type having a structure in which a touch sensor is inserted into the LCM. The add-on type has been known to have excellent touch sensitivity in comparison to the in-cell type for the reason that a touch sensor thereof is disposed outside.

Further, the touch screen technology is divided into a resistive type, a capacitive type, an infrared type, and an ultrasonic type based on how a touch input is sensed. In general, the capacitive type is widely used for a small-sized display device, and the capacitive type is divided into a self-capacitive type and a mutual capacitive type.

The self-capacitive type senses a change in capacitance using one electrode per pixel for touch recognition. But, the self-capacitive type touch screen has a disadvantage that only one finger can be used although the touch sensitivity is excellent.

The mutual capacitive type touch screen having a grid electrode structure of a horizontal axis and a vertical axis measures capacitance formed at an intersection between electrodes. The mutual capacitive type touch screen advantageously has a multi-touch function.

The applicant of the present application has proposed a new in-cell type made by combining only the advantages of the self-capacitive type and the mutual capacitive type, and the new in-cell type is called an advanced in-cell touch (AIT). The AIT type based on the self-capacitive type utilizes a plurality of touch electrodes as a touch electrode during a touch sensing period, and the plurality of touch electrodes as a common electrode to which a common voltage is applied during a display period.

The AIT type has excellent touch sensitivity and a multi-touch function, and makes it possible to manufacture a thin touch screen device. Further, it is possible to reduce a bezel area because left and right bezels do not need touch lines, and reduce a manufacturing cost in comparison to the add-on type.

However, the applicant found out that, when an initial driving operation or rebooting operation is performed by turning on a power source of an image display device such as a liquid crystal display device to which the AIT type is applied, a touch driving defect may occur due to an abnormality in a power supply and an abnormality in a communication interface. A bigger problem may be that it is unclear whether the initial driving defect is caused by a power supply error, a communication interface error, or a firmware execution error of a touch sensing control circuit, and thus it may be difficult to immediately find out the cause of the defect and resolve the defect.

In conventional technology, when the initial driving defect is sensed, the touch sensing control circuit is configured to be automatically reset and repeatedly driven. However, a simple method which allows a reset operation to be repeatedly performed is not a solution to the defect, but rather causes additional problems such as the communication interface being interrupted by successive reset operations.

SUMMARY OF THE INVENTION

Embodiments of the present disclosure provide a touch sensing device which can quickly and easily resolve an initial driving (or rebooting) defect occurring due to an abnormality in an initial power supply, an abnormality in a communication interface and the like, and provide an image display device using the touch sensing device by securing a recovery time for finding out a cause of the defect and changing a firmware of the touch sensing device.

The touch sensing device according to embodiments of the present disclosure can include a plurality of touch sensors included in an image display panel, a touch sensing circuit unit configured to supply a driving signal to the touch sensors, receive a touch voltage from the touch sensors and generate sensing data based on a touch sensing result of the image display panel, and a micro control unit configured to determine whether or not the plurality of touch sensors, the touch sensing circuit unit and a self-stored firmware operate normally when a power source of the touch sensing device is turned on and allow a touch sensing operation to be performed normally or delay a reset operation in a predetermined period unit and repeatedly perform the reset operation in a predetermined delay period unit based on a result of previous determination.

The image display device using the touch sensing device according to embodiments of the present disclosure can include an image display panel including a plurality of pixel arrays arranged thereon to display an image and configured to sense a touch input through the plurality of touch sensors, a timing controller configured to control driving timings of gate and data drivers so that the image display panel display an image, a touch sensing device configured to determine whether or not there is a touch sensing defect, delay a reset operation in a predetermined period unit and repeatedly perform the reset operation in a predetermined delay period unit when it is determined that there is a touch sensing defect, and drive a touch sensor of the image display panel and output touch coordinate information based on a touch sensing result when it is determined to be in a normal operation state, and a host system configured to supply image data and a plurality of timing signals to the timing controller and execute an application program associated with the touch coordinate information supplied from the touch sensing device.

When an initial driving (or rebooting) defect occurs due to an abnormality in an initial power supply, an abnormality in a communication interface and the like, the touch sensing device and the image display device using the touch sensing device according to embodiments of the present disclosure can secure time for quickly finding out a cause of the defect, and reading or recording a firmware of the touch sensing device. Thus, it is possible to quickly and easily find out a cause of the initial driving defect and precisely resolve the defect.

In particular, the touch sensing device and the image display device using the touch sensing device can improve work efficiency for defect resolution, satisfaction and reliability of a user such as a worker.

DETAILED DESCRIPTION OF EMBODIMENTS

The above-described aspects, features and advantages will be described in detail with reference to the accompanying drawings, so that those skilled in the art can easily carry out a technical idea of the present disclosure. In the description of the embodiments, the detailed description of well-known related configurations or functions will be omitted when it is deemed that such description will cause ambiguous interpretation of the present disclosure.

The display device according to embodiments of the present disclosure may be implemented as a flat panel display device such as a liquid crystal display device, a field emission display device, an organic light emitting diode display device, an electrophoresis display device, a quantum dot display device and the like. In the following embodiments, the liquid crystal display device is described as an example of the flat panel display device, but the display device according to embodiments of the present disclosure is not limited to the liquid crystal display device. Further, a user herein can include any person or entity that uses or accesses the identified device, and can include, but is not limited to, a worker, an administrator, a technician, an end user, etc. Hereinafter, preferred embodiments of the present disclosure will be described in detail with reference to the accompanying drawings.

Figure 1:
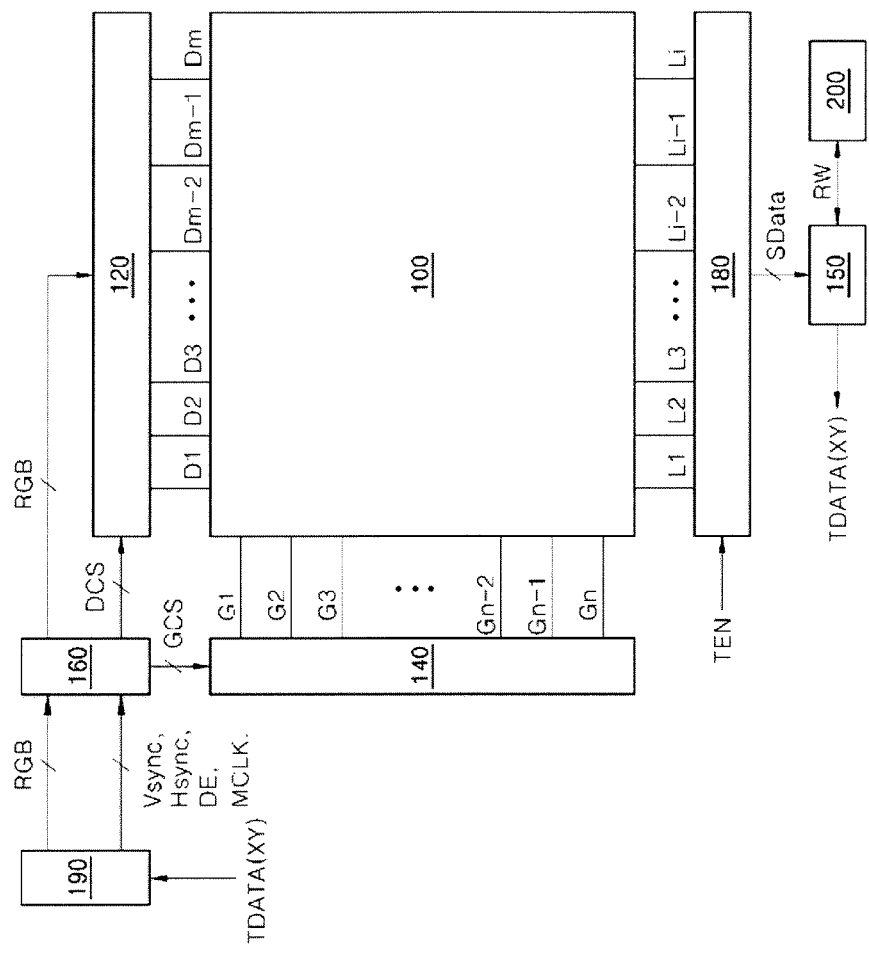
FIG. 1 is a block diagram illustrating a touch sensing device and an image display panel using the touch sensing device according to an embodiment of the present disclosure.

FIG. 1 is a block diagram illustrating a touch sensing device and an image display panel using the touch sensing device according to an embodiment of the present disclosure. All the components of the touch sensing device and the image display panel using the touch sensing device according to all embodiments of the present disclosure are operatively coupled and configured.

The image display device illustrated in FIG. 1 can include an image display panel 100, a gate driver 140, a data driver 120, a timing controller 160, a touch sensing device, and a host system 190. The touch sensing device can include a plurality of touch sensors included in the image display panel 100, a touch sensing circuit unit 180, and a micro control unit 150.

The touch sensing device (e.g., 150 and 180) can determine whether or not there is a touch sensing defect, e.g., whether or not a touch sensing operation is performed normally when a power source thereof is turned on. When it is determined that there is a touch sensing defect, the touch sensing device can delay a reset operation in a predetermined period unit and perform the reset operation in a predetermined delay period unit. When it is determined to be in a normal operation state, the touch sensing device can drive a touch sensor of the image display panel 100 and output touch coordinate information TDATA(XY) based on a touch sensing result.

When the touch sensing device (e.g., 150 and 180) determines that there is a touch sensing defect, the touch sensing device can further include a computer 200 electrically connected thereto and configured to support a user such as a worker to find out a cause of the touch sensing defect and resolve the defect.

The image display panel 100 can include a plurality of pixel arrays arranged thereon to display an image, and sense a touch input through a plurality of touch sensors. For this purpose, the image display panel 100 can include pixels for displaying an image based on an image signal input from the data driver 120, and touch sensors for sensing a touch input.

An upper substrate of the image display panel 100 can include a black matrix, a color filter, and the like. A lower substrate of the image display panel 100 can have a color filter on thin film transistor (COT) structure. A common electrode to which a common voltage is supplied can be disposed on the upper substrate or the lower substrate of the image display panel 100. Here, the common electrode can also function as a touch sensor for sensing a touch put.

A backlight unit can be disposed on a rear surface of the image display panel 100.

The gate driver 140 can sequentially drive gate lines (G1, G2, . . . Gn, where n is a positive integer) of the image display panel 100 so that the image display panel 100 displays an image. For this purpose, the gate driver 140 can sequentially generate gate-on signals in response to gate control signals GCS supplied from the timing controller 160, for example, can sequentially generate gate-on signals in response to a gate start pulse and a gate shift clock. Further, the gate driver can control pulse widths of gate-on signals sequentially generated in response to a gate output enable signal to sequentially supply the gate-on signal to the gate lines.

The data driver 120 can drive data lines (D1, D2, . . . Dm, where m is a positive integer) of the image display panel 100 so that the image display panel 100 displays an image. For example, the data driver 120 can supply an image signal to the respective pixels through the data lines of the image display panel 100.

For this purpose, the data driver 120 can convert image data RGB supplied from the timing controller 160 into an analog voltage, that is, an analog image signal using a source start pulse and a source shift clock among data control signals DCS supplied from the timing controller 160. Further, the data driver 120 can supply the image signal to the respective data lines in response to a source output enable signal.

The timing controller 160 can arrange the image data RGB input through the host system 190 in accordance with driving characteristics such as image display resolution of the image display panel 100 and the like, and supply the image data RGB to the data driver 120.

Further, the timing controller 160 can receive timing signals such as a vertical synchronization signal Vsync, a horizontal synchronization signal Hsync, a data enable signal DE and a main clock MCLK input from the host system 190 to control driving timings of the data driver 120 and the gate driver 140.

Specifically, the timing controller 160 can generate gate and data control signals GCS and DVSDCS using the timing signals such as the vertical synchronizing signal Vsync, the horizontal synchronizing signal Hsync, the data enable signal DE, and the main clock MCLK input from the host system 190, and supply the gate and data control signals GCS and DV-SDCS to the gate and data drivers 140 and 120, respectively, so as to control the driving timings of the gate and data drivers 140 and 120.

The host system 190 can include a system on chip SoC with a built-in scaler so as to convert the image data RGB into a format suitable for being displayed on the image display panel 100. The host system 190 can transmit the timing signals Vsync, Hsync, DE and MCLK to the timing controller 160 together with the format-converted image data RGB, and execute an application program associated with touch coordinate information TDATA (XY) input from the touch sensing device (e.g., 150 and 180).

The touch sensing device (e.g., 150 and 180) can determine whether or not a touch sensing operation is performed normally every time the power source thereof is turned on by an initial booting or rebooting operation. When it is determined that there is a defect, the touch sensing device can autonomously delay a reset operation in a predetermined period unit and repeatedly perform the reset operation in a predetermined delay period unit. When it is determined to be in a normal operation state, the touch sensing device can drive a touch sensor of the image display panel 100 and output touch coordinate information TDATA(XY) based on a touch sensing result.

The computer 200 can be a notebook computer, a personal computer, a portable electronic device, a smart phone or device, an inspection tool, etc. When the touch sensing device (e.g., 150 and 180) determines that there is a touch sensing defect, the computer 200 can be electrically connected to the touch sensing device and support a user such as a worker to find out a cause of the defect and resolve the touch sensing defect by reading or newly recording the firmware.

As illustrated in FIG. 1, the touch sensing device can include a plurality of touch sensors included in the image display panel 100, the touch sensing circuit unit 180 configured to apply a driving signal to the touch sensors, receive a touch voltage in synchronization with the applied driving signal, and generate sensing data based on a touch sensing result of the image display panel 100, and the micro control unit 150 configured to determine whether or not the plurality of touch sensors, the touch sensing circuit unit 180 and a self-stored firmware operate normally when the power source of the touch sensing device is turned on, and allow a touch sensing operation to be performed normally or autonomously delay a reset operation in a predetermined period unit and repeatedly perform the reset operation in a predetermined delay period unit based on a result of previous determination.

The micro control unit 150 can sequentially scan and inspect whether or not power is supplied to each of the plurality of the touch sensors and the touch sensing circuit unit 180, it is possible to perform a communication interface with the touch sensing circuit unit 180, and the self-stored firmware operates normally every time the power source of the touch sensing device is turned on by an initial booting or rebooting operation.

When the micro control unit 150 determines that the plurality of touch sensors, the touch sensing circuit unit 180, and the self-stored firmware operate normally, the micro control unit 150 can analyze sensing data of the touch sensing circuit unit 180 using a touch sensing algorithm and transmit an identification code and coordinate information TDATA (XY) of the sensing data to the host system 190 based on an analysis result.

When the micro control unit 150 determines that a defect has occurred in at least one of the plurality of touch sensors, the touch sensing circuit unit 180, and the self-stored firmware, the micro control unit 150 can delay a reset operation in a predetermined period unit and perform the reset operation in a predetermined delay period unit. The micro control unit 150 can transmit a defect occurrence signal to the host system 190 while the reset operation is repeatedly performed in a predetermined delay period unit so that the host system 190 displays a defect occurrence situation through an image or sound.

When the touch sensing device (e.g., 150 and 180) determines that there is a touch sensing defect and informs a user of a touch sensing defect occurrence, the external computer 200 can be electrically connected to the micro control unit 150 of the touch sensing device. The connected computer 200 can scan the plurality of touch sensors and the touch sensing circuit unit 180 and sequentially inspect whether or not power is supplied to each of the plurality of the touch sensors and the touch sensing circuit unit 180, it is possible to perform a communication interface with the touch sensing circuit unit 180 and the micro control unit 150, and the firmware stored in the micro control unit 150 operates normally so as to find out a cause of the defect. The computer 200 can support the user to resolve the touch sensing defect by reading or newly recording the firmware of the micro control unit 150.

Figure 2:
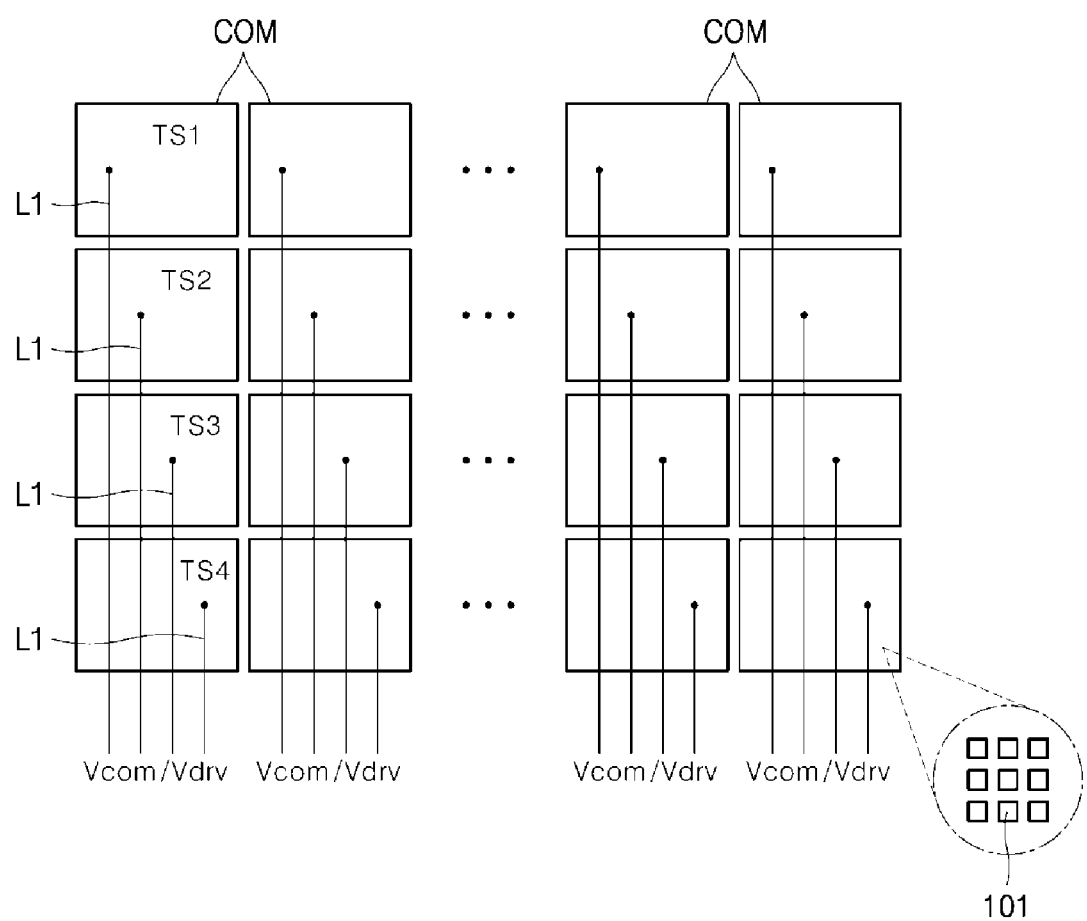
FIG. 2 is a block diagram illustrating a structure of an advanced in-cell touch (AIT) type image display panel according to an embodiment of the present disclosure.

FIG. 2 is a block diagram illustrating a structure of an AIT type image display panel according to an embodiment of the present disclosure.

Referring to FIGS. 1 and 2, the image display panel 100 according to embodiments of the present disclosure can include the plurality of touch sensors to perform a touch sensing operation while displaying an image.

The touch sensors TS1 to TS4 can be implemented as capacitive sensors that sense a touch input in a capacitive manner. Capacitance can be divided into self-capacitance and mutual capacitance. The self-capacitance can be formed along a single-layered conductor wiring formed in one direction, and the mutual capacitance can be formed between two conductor wirings orthogonal to each other.

The touch sensors TS1 to TS4 can be embedded in a pixel array of the image display panel 100. Referring to FIG. 2, each of the pixels of the image display panel 100 can include the touch sensors TS1 to TS4 and sensor lines L1 to Li (i is a positive integer less than m and n) respectively connected to the touch sensors TS1 to TS4. A common electrode COM of the pixels 101 can be divided into a plurality of segments.

The touch sensors TS1 to TS4 can be implemented as the divided common electrode COM.

One common electrode segment can be connected to the plurality of pixels in common and form one touch sensor. The touch sensors TS1 to TS4 can supply a common voltage Vcom to the pixels during an image display period and receive a touch driving signal Vdry during a touch sensor driving period so as to sense a touch input. FIG. 2 illustrates a self-capacitance type touch sensor, but the touch sensors TS1 to TS4 are not limited thereto.

Figure 3:
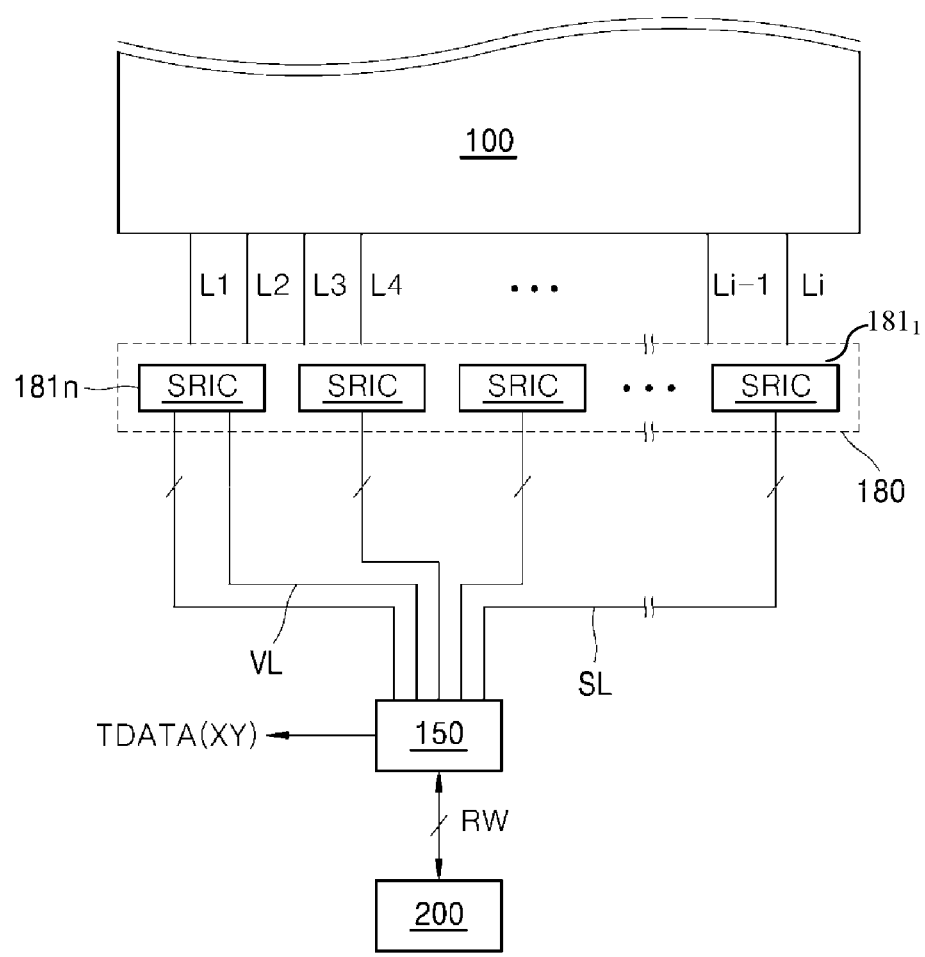
FIG. 3 is a block diagram specifically illustrating the touch sensing device of FIG. 1.

FIG. 3 is a block diagram specifically illustrating the touch sensing device of FIG. 1.

As illustrated in FIG. 3, the touch sensing circuit unit 180 of the touch sensing device can include a plurality of sensing integrated circuits SRIC $181_1$ . . . $181n$, and the sensing integrated circuits SRIC $181_1$ . . . $181n$ can be formed on a printed circuit board different from the image display panel 100.

When a sensing operation is performed normally in a state in which the power source of the touch sensing device (e.g., 150 and 180) is turned on, each of the sensing integrated circuits $181_1$ . . . $181n$ can apply a driving signal to the touch sensors TS1 to TS4 formed on the image display panel 100, sense a charge variation of each of the touch sensors TS1 to TS4 in synchronization with the applied driving signal, and generate sensing data SData based on a touch voltage which is received differently in accordance with the charge variation.

The generated sensing data SData can be transmitted to the micro control unit 150. The driving signal supplied to the touch sensors TS1 to TS4 can be generated in various forms such as a pulse, a sine wave, and a triangular wave. Each of the sensing integrated circuits $181_1$ . . . $181n$ can store the sensing data SData obtained through each of the touch sensors TS1 to TS4 in a buffer memory, and simultaneously output previous sensing data SData supplied from the buffer memory to the micro control unit 150.

When the power source of the touch sensing device (e.g., 150 and 180) is turned on, the micro control unit 150 can determine whether or not power is supplied to each of the sensing integrated circuits $181_1$ . . . $181n$ through a power supply line VL directly connected to at least one of the sensing integrated circuits $181_1$ . . . $181n$.

The power supply line VL can be connected to each of the sensing integrated circuits $181_1$ . . . $181n$ in series or in parallel on a one-to-one basis. Accordingly, when the power source of the touch sensing device (e.g., 150 and 180) is turned on, the micro control unit 150 can determine whether or not power is supplied to each of the sensing integrated circuits $181_1$ . . . $181n$ through the power supply line VL.

The micro control unit 150 can allow the driving signal to be applied to each of the touch sensors through each of the sensing integrated circuits $181_1$ . . . $181n$, and check the sensing data SData which is fed back from each of the touch sensors to determine whether or not each of the touch sensors have a driving defect. In addition, the micro control unit 150 can perform a predetermined initial operation of the self-stored firmware or execute a program of the self-stored firmware to determine whether or not the self-stored firmware operates normally.

Subsequently, the micro control unit 150 can execute a predetermined touch recognition algorithm when the sensing integrated circuits $181_1$ . . . $181n$ operate normally. Any publicly known algorithm can be used as the touch recognition algorithm.

The touch recognition algorithm can compare the sensing data SData input from the sensing integrated circuits $181_1$ . . . $181n$ with a predetermined reference value (or a threshold value), and determine the touch sensing data SData equal to or greater than the reference value as touch input data obtained from the touch sensors at touch input positions.

The touch recognition algorithm can assign an identification code to each of the touch input data equal to or greater than the reference value and calculate coordinates of each of the touch input positions. The micro control unit 150 can transmit the identification code and coordinate information (XY) of each of the touch input data to the host system 190.

Figure 4:
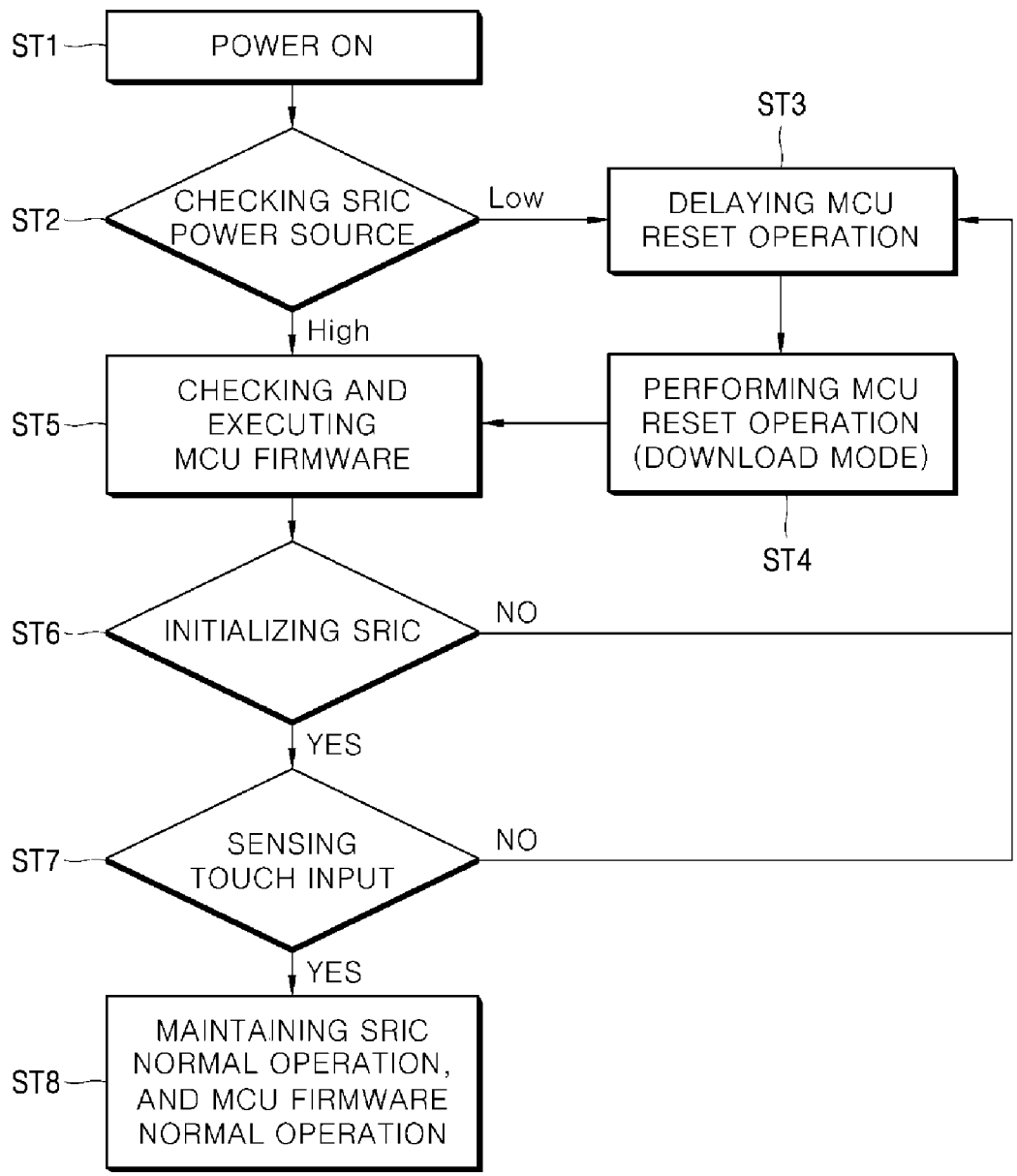
FIG. 4 is a flow chart for explaining a defect occurrence check of the touch sensing device illustrated in FIG. 3 and an operation of the touch sensing device performed in response to a defect occurrence according to an embodiment of the present disclosure.

FIG. 4 is a flow chart for explaining a detect occurrence check of the touch sensing device illustrated in FIG. 3 and an operation of the touch sensing device performed in response to a defect occurrence according to an embodiment of the present disclosure.

As illustrated in FIG. 4, when the power source of the touch sensing device (e.g., 150 and 180) is turned on (ST1), the micro control unit 150 of the touch sensing device can determine whether or not power is supplied to each of the sensing integrated circuits $181_1$ . . . $181n$ through the power supply line VL directly connected to at least one of the sensing integrated circuits $181_1$ . . . $181n$ (ST2). At this time, when the power supply line VL is at a low voltage level, it can be determined that there is a defect in supplying power. Only when the power supply line VL is at a high voltage level, it can be determined that power is supplied normally.

When the micro control unit 150 senses that the power supply line VL is at a low voltage level, and accordingly determines that no power is supplied to at least one of the sensing integrated circuits $181_1$ . . . $181n$, the micro control unit 150 can autonomously perform a reset operation. At this time, the reset operation can be repeatedly performed after being delayed for a predetermined period, for example, 7 seconds (ST3).

The micro control unit 150 can transmit a defect occurrence signal to the host system 190 during a period in which the reset operation of the micro control unit 150 is delayed so that the host display system 190 displays a defect occurrence situation of the micro control unit 150 through an image or sound.

Also, the external computer 200 can be electrically connected to the micro control unit 150 during the period in which the reset operation of the micro control unit 150 is delayed.

Accordingly, the computer 200 can scan the plurality of touch sensors and the touch sensing circuit unit 180, and sequentially inspect whether or not power is supplied to each of the plurality of the touch sensors and the touch sensing circuit unit 180, it is possible to perform a communication interface with the touch sensing circuit unit 180 and the micro control unit 150, and the firmware stored in the micro control unit 150 operates normally so as to find out a cause of the defect.

The computer 200 can find out and resolve a point of a defect occurring when power is supplied, or support a user such as a worker to resolve the touch sensing defect by reading or newly recording the firmware of the micro control unit 150 (ST4).

When the micro control unit 150 senses that the power supply line VL is at a high voltage level, the micro control unit 150 can perform a predetermined initial operation of the self-stored firmware or execute a program of the self-stored firmware (ST5).

Subsequently, the micro control unit 150 can perform an initialization operation based on an initialization program of the self-stored firmware (ST6). When the initialization operation is not properly performed, the micro control unit 150 can determine that there is a defect in the firmware, and autonomously perform the reset operation (ST3).

However, when the initialization operation of the firmware of the micro control unit 150 is properly performed, the micro control unit 150 can allow the driving signal to be applied to each of the touch sensors through each of the sensing integrated circuits $181_1 \ldots 181n$, and check the sensing data SData which is fed back from each of the touch sensors to determine whether or not each of the touch sensors has a driving defect. When it is determined that each of the touch sensors has a driving defect, the micro control unit 150 can autonomously perform the reset operation (ST3).

When the micro control unit 150 determines that each of the touch sensors operates normally, the micro control unit 150 can autonomously execute the firmware to perform the touch recognition algorithm.

That is, the micro control unit 150 can compare the sensing data SData input from the sensing integrated circuits $181_1 \ldots 181n$ with a predetermined reference value (or a threshold value), and determine the touch sensing data SData equal to or greater than the reference value as touch input data obtained from the touch sensors at touch input positions. The micro control unit 150 can transmit the identification code and coordinate information (XY) of each of the touch input data to the host system 190.

When an initial driving (or rebooting) defect occurs due to an abnormality in an initial power supply, an abnormality in a communication interface and the like, the touch sensing device 150 and 180 and the image display device using the touch sensing device according to embodiments of the present disclosure can secure time for quickly finding out a cause of the defect, and reading or recording the firmware of the micro control unit 150. Thus, it is possible to quickly and easily find out a cause of the initial driving defect and precisely resolve the defect.

In particular, the touch sensing device and the image display device using the touch sensing device can support a user such as a worker to quickly and easily find out a cause of the initial driving defect and resolve the defect, thereby improving work efficiency for defect resolution, satisfaction and reliability of the user or worker.

The present disclosure described as above is not limited by the embodiments described herein and accompanying drawings. It should be apparent to those skilled in the art that various substitutions, changes and modifications which are not exemplified herein but are still within the spirit and scope of the present disclosure can be made. Therefore, the scope of the present disclosure is defined not by the detailed description, but by the claims and their equivalents, and all variations within the scope of the claims and their equivalents are to be construed as being included in the present disclosure.

What is claimed is:

1. A touch sensing device, comprising:
   a plurality of touch sensors included in an image display panel, the plurality of touch sensors being connected to a corresponding one of a plurality of sensing integrated circuits;
   a touch sensing circuit unit configured to:
      supply a driving signal to each of the touch sensors,
      receive a touch voltage from the touch sensors based on the driving signal supplied to each of the touch sensors, and
      generate sensing data based on a touch sensing result of the image display panel; and
   a micro control unit configured to:
      determine whether or not the touch sensors, the touch sensing circuit unit and a self-stored firmware operate normally when a power source of the touch sensing device is turned on,
      sense a voltage on a power supply line connected to at least one of the plurality of sensing integrated circuits,
      in response to determining that no power is supplied to at least one of the plurality of sensing integrated circuits based on the voltage sensed on the power supply line, transmit a defect occurrence signal to a host system during a predetermined delay period unit in which a reset operation of the micro control unit is delayed, and autonomously perform the reset operation after the predetermined delay period unit has expired and generate a result of the reset operation,
      repeat performance of the reset operation after another predetermined delay period unit based on the result of the reset operation, and
      in response to determining that power is supplied to the plurality of sensing integrated circuits based on the voltage sensed on the power supply line, allow a touch sensing operation to be operated normally.

2. The touch sensing device of claim 1, further comprising:
   a computer electrically connected to the micro control unit,
   wherein when the touch sensing device determines that there is a touch sensing defect, the computer supports a user to resolve the touch sensing defect by inspecting and checking a cause of the touch sensing defect, and reading or newly recording a firmware of the micro control unit.

3. The touch sensing device of claim 1, wherein the micro control unit sequentially scans and inspects whether or not power is supplied to each of the touch sensors and the touch sensing circuit unit, whether or not a communication interface is performed with the touch sensing circuit unit, and whether or not the self-stored firmware operates normally every time a power source of the touch sensing device is turned on by an initial booting or rebooting operation and determines that the touch sensing device operates normally or has a defect based on a result of previous inspection.

4. The touch sensing device of claim 1, wherein the host display system displays a defect occurrence situation through an image or sound based on the defect occurrence signal.

5. An image display device, comprising:
   an image display panel including a plurality of pixel arrays arranged thereon to display an image, the image display panel configured to sense a touch input through a plurality of touch sensors, the plurality of touch sensors being connected to a corresponding one of a plurality of sensing integrated circuits;
   a timing controller configured to control driving timings of gate and data drivers so that the image display panel displays an image;
   a touch sensing device configured to:
      sense a voltage on a power supply line connected to at least one of the plurality of sensing integrated circuits,
      in response to determining that no power is supplied to at least one of the plurality of sensing integrated circuits based on the voltage sensed on the power supply line, transmit a defect occurrence signal during a predetermined delay period unit in which a reset operation of touch sensing device is delayed, and autonomously perform the reset operation after the predetermined delay period unit has expired and generate a result of the reset operation, repeat performance of the reset operation after another predetermined delay period unit based on the result of the reset operation, and in response to determining that power is supplied to the plurality of sensing integrated circuits based on the voltage sensed on the power supply line, allow a touch sensing operation to be operated normally and output touch coordinate information based on a touch sensing; and a host system configured to:

supply image data and a plurality of timing signals to the timing controller, and execute an application program associated with the touch coordinate information supplied from the touch sensing device.

6. The image display device of claim 5, wherein the touch sensing device comprises:

a touch sensing circuit unit configured to:

supply a driving signal to the plurality of touch sensors, receive a touch voltage from the touch sensors and generate sensing data based on a touch sensing result of the image display panel; and a micro control unit configured to:

determine whether or not the touch sensors, the touch sensing circuit unit and a self-stored firmware operate normally when a power source of the touch sensing device is turned on, and allow a touch sensing operation to be operated normally or delay the reset operation.

7. The image display device of claim 6, further comprising:

a computer electrically connected to the micro control unit, wherein when the touch sensing device determines that there is a touch sensing defect, the computer supports a user to resolve the touch sensing defect by inspecting and checking a cause of the touch sensing defect, and reading or newly recording a firmware of the micro control unit.

8. The image display device of claim 6, wherein the micro control unit sequentially scans and inspects whether or not power is supplied to each of the touch sensors and the touch sensing circuit unit, whether or not a communication interface is performed with the touch sensing circuit unit, and whether or not the self-stored firmware operates normally every time a power source of the touch sensing device is turned on by an initial booting or rebooting operation, and determines that the touch sensing device operates normally or has a defect based on a result of previous inspection.

9. The image display device of claim 6, wherein the host display system displays a defect occurrence situation through an image or sound based on the defect occurrence signal.

10. A touch sensing device, comprising:

a plurality of touch sensors connected to a corresponding one of a plurality of sensing integrated circuits; and a controller configured to:

sense a voltage on a power supply line connected to at least one of the plurality of sensing integrated circuits, in response to determining that no power is supplied to at least one of the plurality of sensing integrated circuits based on the voltage sensed on the power supply line, transmit a defect occurrence signal to a host system during a predetermined delay period unit in which a reset operation of the controller is delayed, and autonomously perform the reset operation after the predetermined delay period unit has expired and generate a result of the reset operation, and in response to determining that power is supplied to the plurality of sensing integrated circuits based on the voltage sensed on the power supply line, allow a touch sensing operation to be operated normally.

11. The touch sensing device of claim 10, wherein the controller is further configured to:

repeat performance of the reset operation after another predetermined delay period unit based on the result of the reset operation.

12. The touch sensing device of claim 10, wherein the controller is further configured to:

in response to determining that a communication interface is not performed with a touch sensing circuit unit configured to drive each of the plurality of touch sensors, transmit the defect occurrence signal to the host system, and autonomously perform the reset operation after the predetermined delay period unit has expired, and in response to determining that self-stored firmware of the controller does not operate normally when a power source of the touch sensing device is turned on by an initial booting or rebooting operation, transmit the defect occurrence signal to the host system, and autonomously perform the reset operation after the predetermined delay period unit has expired.

13. The touch sensing device of claim 10, wherein the host display system displays a defect occurrence situation through an image or sound based on the defect occurrence signal.

* * * * *